United States Patent [19] [11] 4,161,692
Tarzwell [45] Jul. 17, 1979

[54] PROBE DEVICE FOR INTEGRATED CIRCUIT WAFERS

[75] Inventor: John W. Tarzwell, Phoenix, Ariz.

[73] Assignee: Cerprobe Corporation, Tempe, Ariz.

[21] Appl. No.: 816,337

[22] Filed: Jul. 18, 1977

[51] Int. Cl.² .................... G01R 1/06; G01R 31/02
[52] U.S. Cl. ....................... 324/158 P; 174/126 C;
324/72.5; 324/158 F
[58] Field of Search ............ 324/158 P, 158 F, 72.5;
174/126 C, 117 PC; 339/278 C, 278 D, 108 TP

[56] References Cited

U.S. PATENT DOCUMENTS

| | | | |
|---|---|---|---|
| 2,641,672 | 6/1953 | Parrish | 174/126 C |
| 3,849,728 | 11/1974 | Evans | 324/158 F |

Primary Examiner—Rudolph V. Rolinec
Assistant Examiner—Ernest F. Karlsen
Attorney, Agent, or Firm—Spensley, Horn & Lubitz

[57] ABSTRACT

A probe device for testing integrated circuit wafers is disclosed. The probe device comprises a support means, which has metallized portions, and an aperture. A plurality of "L" shaped holding means, each having a thin metallized surface, are coupled to metallized portions of the support means so that a portion of the holding means extends into the aperture. Coupled to the metallized surface of each of the holding means is a corresponding needle-like probe member which has a curved portion. These probe members are coupled to the holding means in such a manner that their curved portions extend into the support means aperture so as to electrically contact a circuit wafer placed therein, and thereby electrically couple the circuit wafer to the support means, and ultimately to circuit testing apparatus.

12 Claims, 11 Drawing Figures

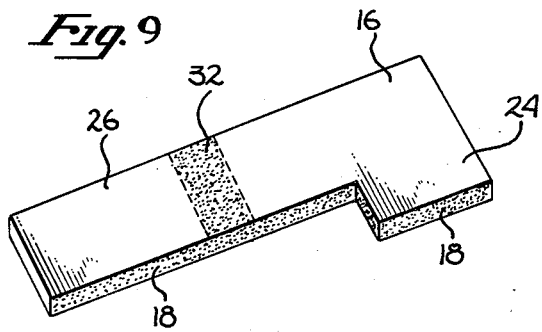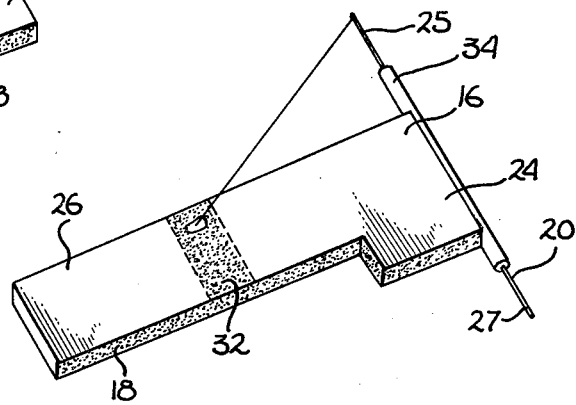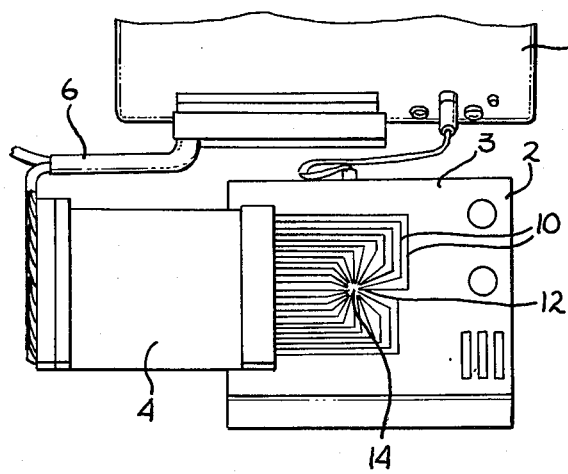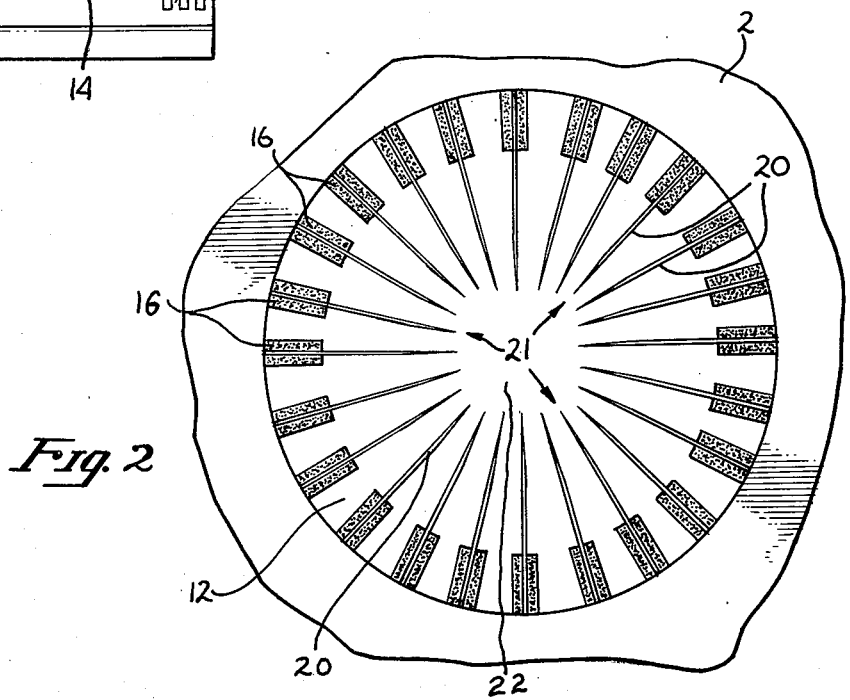

PROBE DEVICE FOR INTEGRATED CIRCUIT WAFERS

BACKGROUND OF THE INVENTION

1. Field of the Invention

The present invention relates to the field of integrated circuit testing devices, and more specifically, to a probe device for testing integrated circuit wafers.

2. Prior Art

In the modern manufacture of integrated circuits, several hundred to several thousand integrated circuits are fabricated in a single circuit wafer. In such a batch fabrication process, the yield of usable integrated circuits is very low. Due to this low yield, a method has been developed to test each individual wafer to determine the functional integrated circuits contained therein. Without such a method, each integrated circuit must be severed from the wafer and mounted so that it may be tested individually.

Presently, probe cards, in combination with automatic test equipment, are being utilized during the manufacture of integrated circuits to determine the usability of the individual circuits. In general, the probe cards consist of multi-probe members which are mechanically held in contact with the circuit wafers. Such mechanical contact allows electrical testing of the individual integrated circuits prior to their severance from the wafer. Thus, the required input voltages and input signals may be provided to the individual integrated circuit by the automatic test equipment and the resulting output signals may be monitored and evaluated by the test equipment. Often, it is desired to use these probe cards to couple high frequency signals to the integrated circuit wafers and to allow monitoring of high frequency output signals. Also, it would be valuable to use these probe cards at elevated temperatures to determine if the integrated circuits are functional at such temperatures.

One prior art attempt to provide the testing capabilities noted above is what is generally referred to as the blade probe card. The blade probe card consists of an epoxy-glass printed circuit card to which is affixed a plurality of berylium-copper blades. A metal needle-like probe is then soldered to each blade and all the probes are configured so that they may contact the pads of an integrated circuit wafer.

The blade probe card, however, has several distinct disadvantages. The greatest disadvantage is its high electrical capacitance between circuit paths resulting from the parallel configuration of the metal blades. That is, the necessary closeness and parallelism of the metal blades results in a capacitive effect between the individual blades. Due to this high capacitance, the blade probe card cannot be used for testing a variety of integrated circuits, including some metal-oxide silicon (MOS) circuits, and for general high frequency testing.

Another disadvantage of the blade probe card is the lack of stiffness of the berylium copper blade. This blade will flex under light pressure and when bent, will only slowly return to its original configuration. The lack of stiffness produces alignment and planarization problems, resulting in a variation of force between the probes when they are applied to the circuit wafer. This variation in force produces two detrimental results. First, those probes which will apply more force to the circuit wafer can cause damage to the corresponding wafer pad. Second, the variation in force results in inconsistent contact resistance from one probe to another.

A further problem with the blade probe card is its inability to be used at elevated temperatures since the plastic components of the epoxy-glass card degrade at such temperatures.

A still further disadvantage of the blade probe card results from the low surface resistance and low dielectric constant of the epoxy-glass material. Such probe cards optimally should have infinite surface resistance to allow total isolation of circuit paths. However, since the epoxy-glass material has a low surface resistance, the individual circuit paths are allowed to interact to the detriment of integrated circuit testing. Also, the low dielectric constant of the epoxy-glass material limits the upper frequency at which the card can be used because of the resulting higher capacitance between individual circuit paths.

A second prior art attempt to provide the testing capabilities noted above is the Epoxy-ring card. These cards consist of an Epoxy-glass card which has probes soldered to copper strips which are affixed to the Epoxy-glass. However, the epoxy-ring card also has a variety of disadvantages. One disadvantage, difficulty of repair, stems from the method of affixing the copper strips to the Epoxy-glass. The copper strip is laminated or glued to the Epoxy-board and the probe is then soldered to the strip. If a probe becomes damaged and must be replaced, a new probe will have to be soldered to the copper strip. However, this heating of the strip causes the adhesive which holds it to the card to degrade, allowing the strip to move up and away from the card. Such damage to the copper strip prevents the card from being used again. Repair of the Epoxy-ring card is further hindered by the difficulty of properly aligning the new probe with the original probes.

Another problem associated with the Epoxy-ring card is the flexibility of the card. Since such cards are not rigid, the individual probes soon lose their planarity and alignment with the other probes. Such lack of planarity, as in the case of the blade probe card, results in damage to the circuit wafers and variation in contact resistance.

Further disadvantages of the epoxy-ring card, just as in the blade probe card, are a consequence of the utilization of Epoxy-glass material. The epoxy-ring card also cannot be used at elevated temperatures since the plastic components of the glass material will deteriorate. In addition, the low surface resistance of the glass material and its low dielectric constant allows interaction of the input and monitoring lines as well as limiting its high frequency use.

Due to the diversity of integrated circuits presently available, and the fact that each type of integrated circuit has its own requirements for testing, one piece of test equipment has typically been designed to automatically test each type of circuit. This customized test equipment has required a substantial investment to design and develop, but each is limited by the one class of integrated circuits it can test and even this specialization has not provided the precision testing which is required.

One major limitation in the present automatic test equipment has been the inability to place the necessary compensating networks physically close to the integrated circuit under test. Thus, low level signals which are often at high frequency must travel a great distance from the probe card to the test equipment. Due to the impedance of this long circuit path, degradation of the signal which is to be monitored results so that the testing loses its accuracy. For example, the testing capability of the present automatic test equipment would be greatly improved if a differential amplifier were placed near a CMOS integrated circuit which is being tested. Such an amplifier would significantly improve the signal to noise ratio of the signal which is monitored by the automatic test equipment. Similar improvements could be created by placing an amplifier which has unity gain and matched impedance close to an ECL circuit which is to be tested.

Also, placing circuits near the integrated circuit under test would allow one central piece of automatic test equipment to service more than one class of circuits. That is, only the testing capabilities common to several classes of integrated circuits would be contained in the central test equipment while probe cards which contain the specialized circuits required for each class may be utilized with the central equipment. In this manner, the overall cost of automatic test equipment could be reduced by making one automatic test station capable of testing several classes of circuits. However, the probe cards of the prior art are not capable of allowing placement of such compensating circuits near the circuit under test since neither the proper support nor the necessary isolation from the monitored signal can be provided.

Therefore, what has been needed is a probe card which has low electrical capacitance so that it may be utilized in the testing of integrated circuits at high frequencies, which has probe tips which remain in a planar configuration, which has high electrical isolation between circuit paths, which is easily repaired, which is insensitive to elevated temperature, and which can provide a compensating circuit adjacent each probe tip.

SUMMARY OF THE INVENTION

The present invention is a probe device for testing integrated circuit wafers. The probe device comprises a support means, a plurality of holding means, and a plurality of corresponding needle-like probe members.

The support means is a substantially rectangular structure having a generally circular aperture, and disposed on the support means are electrically conductive portions. Coupled to the support means is a plurality of "L" shaped holding means. These holding means have an extremely thin metallized area along their bottom surface, and a portion of the holding means extends into the circular aperture of the support means. Coupled to the holding means is a plurality of corresponding needle-like probe members, each having a curved portion. Each probe member is coupled to the narrow surface on the lower portion of the holding means so that the probe member is parallel to the support means while the curved portion of the probe member extends into the circular aperture. The farthest extreme of each of the probe members is configured so as to be capable of electrically contacting a circuit wafer which is placed within the aperture. Each probe member is electrically coupled to the metallized area on the holding means, while the holding means is electrically coupled to conductive portions on the support means. By this manner of electrical coupling, individual conductive portions on the support means are electrically coupled to their corresponding probe members which are in turn electrically coupled to contact pads on the integrated circuit wafer under test.

By the utilization of the specific configuration more fully described below, the present invention allows testing of integrated circuit wafers at high frequency. Due to the configuration and resulting rigidity of the holding means, alignment and planarity of the probe members can be maintained so that damage to pads of integrated circuits under test is virtually eliminated, while the contact resistance of each probe member to its corresponding pad is greatly diminished. Both the support means and holding means may be made of a ceramic material so that the rigidity is further enhanced, the device may be used at elevated temperatures, the high frequency utilization is further enhanced, and the circuit paths are more fully isolated. In addition, the holding means is sufficiently rigid so that a compensating circuit may be placed thereon so as to further improve the testing capability of the probe device.

The novel features which are believed to be characteristic of the invention, both as to its organization and method of operation, together with further objectives and advantages thereof, will be better understood from the following description considered in connection with the accompanying drawings in which a presently preferred embodiment of the invention and alternate embodiments are illustrated by way of example. It is to be expressly understood, however, that the drawings are for the purpose of illustration and description only, and are not intended as a definition of the limits of the invention.

BRIEF DESCRIPTION OF THE DRAWINGS

FIG. 1 is an illustration of the probe device of the present invention and its corresponding testing apparatus;

FIG. 2 is an enlarged view of the holding means and probe members of the present invention;

FIG. 9 is a fourth alternate embodiment of the holding means;

FIG. 10 is the fourth alternate embodiment of the holding means and its corresponding probe member;

FIG. 11 is the first alternate embodiment of the holding means with its compensating circuit.

DETAILED DESCRIPTION OF THE INVENTION

Figure 3:
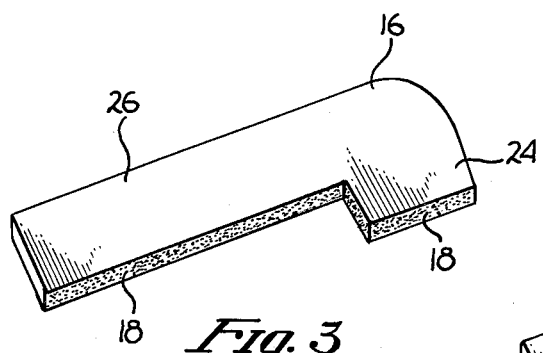
FIG. 3 is the preferred embodiment of the holding means.

Referring first to FIG. 1, probe device 2 is illustrated with its corresponding testing instrumentation 8. Testing instrumentation 8 is coupled to probe device 2 by means of cable 6 and coupling connector 4. Also illustrated in FIG. 1 is support means 3 and its metallized portions 10. Metallized portions 10 are applied to holding means 3 by a silk screening process, with the metallized portion then fired at a very high temperature so that it becomes essentially a part of the holding means. By this method of application, metallized portions 10 have little tendency to lift from holding means 3 when heat is applied. This allows metallized portions 10 to be repeatedly soldered during repair of probe device 2 without degradation. Also illustrated in FIG. 1 is circular aperture 12 of holding means 3 and the location 14 for the integrated circuit wafer which is to be tested.

Now referring to FIG. 2, an enlarged view of circular aperture 12, holding means 16, and probe members 20 can be seen. Probe members 20 are needle-like members which are made of tungsten or similar metal. Probe members 20 are coupled to holding means 16 in a manner which will be more fully described below. It can be seen from FIG. 2 that probe members 20 are configured such that probe tips 21 form a generally square configuration. Probe tips 21 are aligned and configured such that they may make electrical contact with pads on integrated circuit wafers which are to be tested. In operation, probe device 2 is placed over an integrated circuit wafer such that the wafer is located within the square arrangement of tips 21. Probe device 2 is then urged against the integrated circuit wafer so that probe tips 21 make both mechanical and electrical contact with the pads of the circuit wafer. In this way, electrical contact is made from the circuit pads to the metallized portion on support means 10 and ultimately to cable 6 and testing instrumentation 8.

FIG. 3 shows in greater detail "L" shaped holding means 16 with its elongated portion 26 and shortened portion 24. Utilization of an "L" shaped configuration provides structural strength and rigidity in the limited area available for each holding means. Disposed about the bottom periphery of holding means 16 is the extremely thin metallized portion 18. Metallized portion 18 is applied to the narrow surface of holding means 16 in an identical manner as the metallized portions 10 are applied to the support means 3. That is, the metallized portion is silk screened onto the surface of holding means 16 and then fired at a very high temperature.

Figure 4:
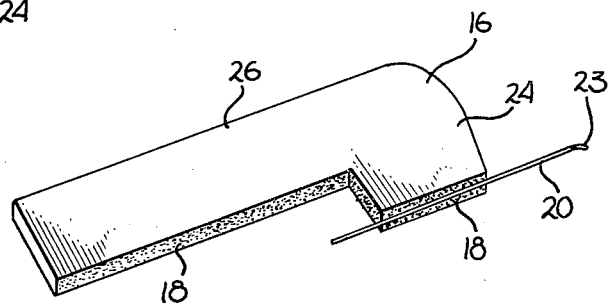
FIG. 4 is the preferred embodiment of the holding means and a corresponding probe member.

FIG. 4 shows in greater detail the preferred embodiment of the coupling of probe member 20 to holding means 16. Here, probe member 20 is soldered to metallized portion 18 along the narrow surface of shortened portion 24. Of course, probe members 20 may also be coupled to holding means 16 by brazing or welding to the metallized portion 18. Probe member 20 is coupled to holding means 16 so that the curved portion 23 of probe member 20 extends beyond holding means 16.

During the manufacture of the present invention, probe tips 21 are sanded to produce a surface parallel to the surface of support means 3. The rigidity characteristic of the configuration utilized in holding means 16 holds probe members 20 and probe tips 21 in a fixed position so that a very flat tip surface can be produced during the sanding operation. The flat surface of probe tip 21 produces two desirable results. First, because the probe tip surface is not pointed or rounded, upon contact with pads of the integrated circuit wafer to be tested, little damage is done to the pad. That is, the flat surface of probe tips 21 greatly reduces scratching and other damage to the pads of the circuit wafer. Secondly, this flat tip surface gives a greater contact area between the probe tip 21 and the pad of the integrated circuit wafer thus reducing the electrical contact resistance. In contrast, the lack of rigidity of the prior art probe devices allows movement of their probe members as they are being sanded. Such movement gives the undesirable result of rounded probe tips which causes inconsistent electrical contact resistance and damage to the pads of the circuit wafer under test.

In can be seen from FIGS. 2 and 4 that there is little parallel surface area of electrical conductors along holding means 16. That is, because the metallized portion 18 of holding means 16 only runs along the lower narrow surface of the holding means, only the extremely thin edge of each metallized portion is parallel to the adjacent narrow edge of the closest holding means 16. Because the capacitive coupling between the adjacent holding means is a function of the adjacent parallel surface area, such a configuration greatly minimizes the capacitive effect between adjacent holding means 16. In contrast, the parallel berylium-copper blades used in the prior art probe device has an adjacent parallel surface area of more than one hundred times that of the present invention. Thus, because capacitance is a function of area, the present invention's configuration of holding means 16 offers a substantially reduced capacitance between adjacent holding means 16. This lowered capacitance allows the present invention to couple high frequency input signals to the integrated circuit under test and to measure output signals from the circuit under test which have high frequency components.

Both holding means 16 and support means 3 may be made of a ceramic material. Such construction would further enhance the high rigidity and low capacitance characteristic of the present invention, and provide greater circuit isolation due to the high surface resistivity of ceramic materials. In addition, construction of ceramic material would allow the present invention to be utilized at elevated temperatures since the device would then consist solely of ceramic materials and metal.

In summary, the novel configuration of the present invention results in a variety of advantages over the prior art. First, the location of the metallized portion 18 on the holding means 16, the thinness of the metallized portion, and the specific configuration of the numerous holding means has greatly minimized the capacitive effect of the closeness of the probe members. Thus, the present invention allows both high frequency input signals to be used in the testing of integrated circuits and the monitoring of high frequency output signals. Also, the "L" shaped design of holding means 16 results in a high degree of rigidity so that the problems of planarity and alignment are vitually eliminated. The resulting consistent force of the probes against the integrated circuit greatly limits pad damage to circuits under test and also eliminates inconsistent contact resistance. Furthermore, since probe members 20 are soldered to metallized portions 18 on the holding means, the repair of the present invention may be rapidly and easily accomplished without damage to the probe device.

FIG. 11 illustrates a first alternate embodiment of holding means 16. Holding means 16 is still an "L" shaped member having elongated portion 26 and shortened portion 24. In this embodiment, however, a compensating circuit 33 is disposed on shortened portion 24, adjacent probe member 20. Compensating circuit 33 is comprised of elements which compensate for or offset the undesirable impedance characteristics associated with the long circuit path between the probe member 20 and the test equipment 8. For example, circuit 33 may be a simple integrated circuit amplifier or it may be a complex impedance matching circuit, depending upon the testing requirements of the integrated circuits under test. Probe member 20 is coupled to metallized portion 18, as is lead 36 of circuit 33. On the other hand, leads 38, 40 and 42 of circuit 33 are coupled to metallized portions 44 on holding means 16. Metallized portions 44 provide the necessary power and signal path for the signal which circuit 33 provides to the test equipment 8. Of course, circuit 33 may also be any integrated circuit which improves the testing capability or versatility of test equipment 8.

Figure 5:
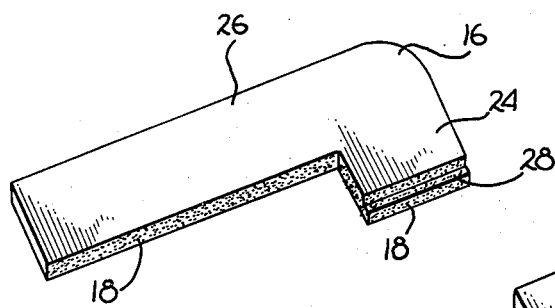
FIG. 5 is a second alternate embodiment of the holding means.
Figure 6:
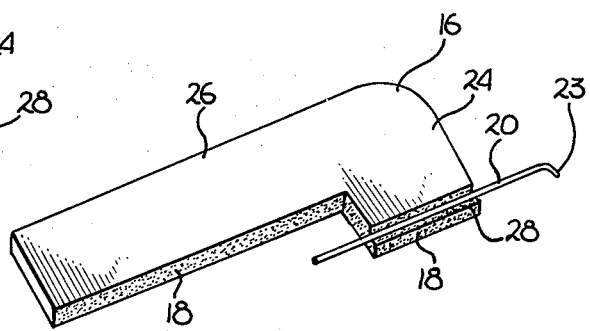
FIG. 6 is the second alternate embodiment of the holding means and its corresponding probe member.

Now referring to FIGS. 5 and 6, a second alternate embodiment of holding means 16 is illustrated. In this embodiment, holding means 16 is still an "L" shaped member having elongated portion 26 and shortened portion 24 and a thin metallized portion 18. However, in this embodiment, holding means 16 has a recess portion 28 disposed at one end of shortened portion 24. FIG. 6 illustrates the coupling of probe member 20 in recess 28. Recess 28 is also metallized so that when probe member 20 is soldered to recess 28, an electrical connection is established between probe member 20 and metallized portion 18.

Figure 7:
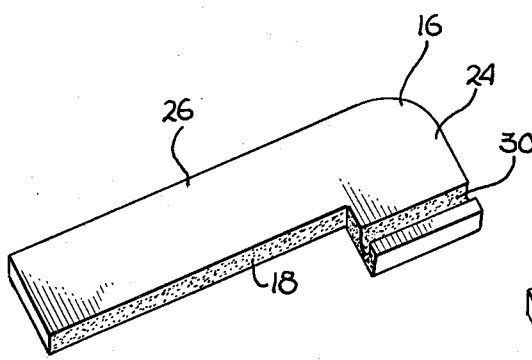
FIG. 7 is the third alternate embodiment of the holding means.
Figure 8:
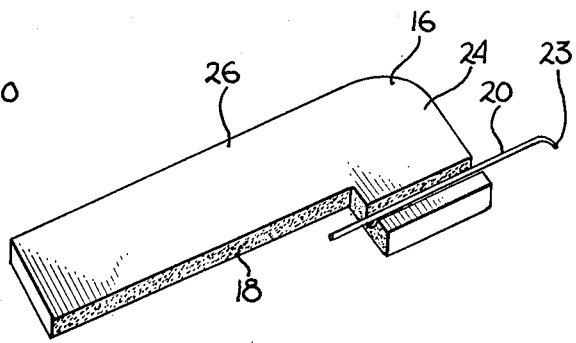
FIG. 8 is the third alternate embodiment of the holding means and its corresponding probe member.

FIGS. 7 and 8 show a third alternate embodiment of holding means 16. In this embodiment, a recess 30 is disposed in shortened portion 24 of holding means 16. Recess 30 is again metallized as is narrow surface 18. Probe member 20 is disposed in recess 30 and soldered therein so that electrical contact is again made between probe member 20 and metallized portion 18.

FIGS. 9 and 10 illustrate a fourth alternate embodiment of holding means 16. Again, holding means 16 is an "L" shaped member having elongated portion 26 and shortened portion 24. Disposed on one surface of elongated portion 26 is a first metallized portion 32 which is coupled to the metallized portion 18 along the lower narrow surface of holding means 16. Disposed along one narrow surface of shortened portion 24 is hollow tubular member 34. Tubular member 34 may be a stainless steel tube of approximately 0.01 inch diameter. Tubular member 34 is coupled to one narrow surface of holding means 16. Disposed in tubular member 34 is probe member 20 having top portion 25 and bottom portion 27. Top portion 25 of probe member 20 is electrically coupled to first metallized portion 32 so that probe member 20 is electrically coupled to metallized portion 18.

There has been described herein a new and novel probe device for the testing of integrated circuit wafers. While specific embodiments of the present invention have been disclosed and described in detail herein, it will be understood by those skilled in the art that various changes in form and detail may be made therein without departing from the spirit and scope of the invention.

What is claimed is:

1. A probe device for testing integrated circuit wafers, said device comprising:
   (a) a support member having an aperture;
   (b) a plurality of ceramic holding members, each said holding member having relatively broad, generally parallel surfaces and relatively narrow edges, at least a portion of one said edge having an electrically conductive path disposed thereon, said holding members coupled to said support member, via one said narrow edge, such that said relatively broad surfaces are generally perpendicular to said support member and such that said holding members extend into said aperture; and
   (c) a plurality of probe members, each said probe member coupled to said electrically conductive path on said narrow edge of each said holding member and extending into said aperture, one or more of said probe members being configured to electrically contact a circuit wafer placed within said aperture.

2. The device according to claim 1 wherein said electrically conductive path is a thin metalized surface disposed on the narrow edge of each said holding member.

3. The device according to claim 2 wherein said support member is made of a ceramic material.

4. The device according to claim 3 wherein said probe member is a needle-like member having a curved portion, said member coupled to said holding member such that said curved portion protrudes therefrom.

5. The device according to claim 1 wherein said support member is made of a ceramic material.

6. The device according to claim 5 wherein said electrically conductive path is a thin metalized surface disposed on the narrow edge of each said holding member.

7. The device according to claim 6 wherein said support member has electrically conductive paths disposed thereon and each said holding member is coupled to said support member by means of affixing said metalized surface of said holding member to said electrically conductive paths on said support member.

8. The device according to claim 7 wherein said probe member is a needle-like member having a curved portion, said member coupled to said holding member such that said curved portion protrudes therefrom.

9. The device according to claim 1 wherein said probe member is a needle-like member having a curved portion, said member coupled to said holding member such that said curved portion protrudes therefrom.

10. The device according to claim 9 wherein said electrically conductive path is a thin metalized surface disposed on the narrow edge of each said holding member.

11. The device according to claim 10 wherein said support member is made of a ceramic material.

12. A system for testing integrated circuits at very high frequencies comprising:
   (a) a support member having an aperture;
   (b) a plurality of ceramic holding members, each said holding member having relatively broad, generally parallel surfaces and relatively narrow edges, at least a portion of one said edge having an electrically conductive path disposed thereon, said holding members coupled to said support member, via one said narrow edge, such that said relatively broad surfaces are generally perpendicular to said support member and such that said holding members extend into said aperture,
   (c) a plurality of probe members, each said probe member coupled to said electrically conductive path on said narrow edge of each said holding member and extending into said aperture, one or more of said probe members being configured to electrically contact a circuit wafer placed within said aperture; and
   (d) a circuit electrically connected to said circuit wafer, via said support member, said holding members and said probe members, for operating and testing said circuit wafer at very high frequencies.

* * * * *